(12) United States Patent
Tseng

(10) Patent No.: US 8,488,320 B2
(45) Date of Patent: Jul. 16, 2013

(54) SEMICONDUCTOR PACKAGE HAVING A COOLING FAN AND METHOD OF FABRICATING THE SAME

(75) Inventor: Hsiang-Wei Tseng, New Taipei (TW)

(73) Assignee: Amtek Semiconductors Co., Ltd., New Taipei (TW)

( * ) Notice: Subject to any disclaimer, the term of this patent is extended or adjusted under 35 U.S.C. 154(b) by 244 days.

(21) Appl. No.: 13/110,670

(22) Filed: May 18, 2011

(65) Prior Publication Data

US 2011/0292607 A1    Dec. 1, 2011

(30) Foreign Application Priority Data

May 26, 2010   (TW) ................................ 99116770 A
Jan. 24, 2011  (TW) ............................... 100102439 A

(51) Int. Cl.
*H05K 7/20*        (2006.01)

(52) U.S. Cl.
USPC ................. 361/695; 361/679.46; 361/679.48; 361/688; 361/694; 165/80.2; 165/80.3; 165/104.33; 257/713; 257/721

(58) Field of Classification Search
USPC ....... 361/679.46–679.55, 688, 689, 690–697, 361/715, 719–724; 165/80.2, 80.3, 104.33, 165/121–126, 185; 257/706–727; 174/16.3, 174/252; 454/184; 415/176, 178, 220, 229; 417/423.1, 423.12, 423.7
See application file for complete search history.

(56) References Cited

U.S. PATENT DOCUMENTS

| | | | |
|---|---|---|---|
| 5,296,775 A * | 3/1994 | Cronin et al. | 310/309 |
| 5,629,560 A * | 5/1997 | Katsui et al. | 257/712 |
| 6,416,300 B1 * | 7/2002 | Tang et al. | 417/423.12 |
| 6,799,282 B2 | 9/2004 | Maeda et al. | |
| 6,876,550 B2 * | 4/2005 | Sri-Jayantha et al. | 361/699 |
| 7,215,548 B1 | 5/2007 | Wu et al. | |
| 7,286,357 B2 | 10/2007 | Wung et al. | |
| 7,321,184 B2 * | 1/2008 | Lee et al. | 310/341 |
| 7,345,884 B2 | 3/2008 | Horng et al. | |
| 7,455,501 B2 * | 11/2008 | Horng et al. | 415/220 |
| 7,568,517 B2 | 8/2009 | Hwang et al. | |
| 8,331,091 B2 * | 12/2012 | Kaslusky et al. | 361/695 |
| 2004/0114327 A1 * | 6/2004 | Sri-Jayantha et al. | 361/695 |

* cited by examiner

*Primary Examiner* — Michail V Datskovskiy
(74) *Attorney, Agent, or Firm* — Edwards Wildman Palmer LLP; Peter F. Corless; Steven M. Jensen

(57) ABSTRACT

A semiconductor package includes: a substrate having a first surface and a second surface opposing the first surface, the first surface having a fan placement zone, a hole and a ventilation hole penetrating the substrate formed at the fan placement zone of the substrate; an electronic component disposed on the first surface surrounding the fan placement zone, the electronic component electrically connected to the substrate; an encapsulant formed on the electronic component and the first surface of the substrate, the encapsulant having an encapsulant opening exposing the fan placement zone; and a fan unit disposed in the encapsulant opening and electrically connected to the substrate. Since the electronic component is disposed on the substrate outside the fan placement zone, heat generated by the electronic component can efficiently dissipate while damage problems of over heat will not occur, and the overall height of the fan unit can thus be decreased.

14 Claims, 9 Drawing Sheets

FIG.2E"

SEMICONDUCTOR PACKAGE HAVING A COOLING FAN AND METHOD OF FABRICATING THE SAME

CROSS-REFERENCES TO RELATED APPLICATIONS

This application claims under 35 U.S.C. §119(a) the benefit of Taiwanese Application Nos. 099116770, filed May 26, 2010, and 100102439, filed Jan. 24, 2011, the entire contents of which are incorporated herein by reference.

BACKGROUND OF THE INVENTION

1. Field of the Invention

The present invention relates to semiconductor packages and methods of fabricating the same, and more particularly, to a semiconductor package having a cooling fan, and a method of fabricating the same.

2. Description of Related Art

A plurality of electronic components, such as CPUs or graphics cards, and a conductive circuit electrically connected to the electronic component are provided on a circuit board, such as a main board or a mother board. In operation, these electronic components generate heat. If the generated heat is not dissipated from an electronic product having the circuit board provided therein to a region outside of the electronic product, the electronic components may malfunction due to overheat. Such a problem is more and more important for electronics having increasing function requirements and higher process speed. Because the promotion of the function and process speed means that there should be more or higher level of electronic components or electronic devices integrated on the circuit board. More or higher level of electronic components or electronic devices will generate more heat. Therefore, a necessary design is to efficiently dissipate the heat generated by the circuit board.

One of heat dissipation approaches generally adopted in the industry is to provide an additional cooling fan on a main board or a mother board so as to dissipate heat generated by an electronic component and/or an electronic device. Such kind of cooling fan has been shown in U.S. Pat. Nos. 6,799,282, 7,215,548, 7,286,357 and 7,568,517.

As illustrated in FIG. 1A, a prior cooling fan is provided on a predetermined location of a circuit board and comprises a printed circuit board 11, a housing 12 and a fan wheel 13. The housing 12 has a base 120, a sleeve pipe 122 and a stator set 121 surrounding the sleeve pipe 122. The fan wheel 13 has a wheel hub 130, a magnet 131 provided on the inner side of the wheel hub 130, a plurality of blades 132 provided on the outer side of the wheel hub 130, and a shaft pillar 133 jointed to the wheel hub 130 so as to be jointed in the sleeve pipe 122. At least one control chip 110 and a plurality of passive components 112 are provided on the printed circuit board 11. The printed circuit board 11 is provided on the base 120 of the housing 12 so as to control the rotation of the fan wheel 13 by the control chip 110 such that the rotation of the fan wheel 13 drives airflow.

The control chip 110 used by the prior cooling fan illustrated in FIG. 1A is a heat generation source. If the generated heat cannot be dissipated, the control chip 110 itself will overheat and fail. Once the control chip 110 fails, the fan wheel 13 cannot operate. Therefore, heat generated by the electronic components on the mother board of the electronic product cannot be dissipated, thereby resulting in a break down or even a damaged electronics. The control chip 110 is positioned in a gap between the base 120 of the housing 120 and the wheel hub 130 of the fan wheel 13. Heat generated by the control chip 110 generally cannot be dissipated due to the narrow gap, and thus results in damaging the control chip 110 due to overheat. A cooling fan is a relatively cheaper one of parts of an electronics. However, an expensive mother board of core components of the electronics will be damaged when the cooling fan fails to work. Hence, the importance of the cooling fan is not evaluated by its price.

In addition, the provision of the control chip 110 affects the size of the gap between the wheel hub 130 of the fan wheel 13 and the base 120 of the housing 12. The height of the gap always has to be increased due to the thickness of the control chip 110 and thus is harm to the decrease of the overall height of such kind of cooling fan. And the provision of the control chip 110 will increase the required area of the printed circuit board 11. Under the condition of not expanding the cross-sectional area of such kind of prior cooling fan, if the area of the printed circuit board increases, the area of the blade should be decreased. However, the decrease of the area of the blade 132 will affect the generation of wind while insufficient wind generation will affect desired heat dissipation effect.

In order to solve the above-mentioned problems, U.S. Pat. No. 7,345,884 provides an improved cooling fan. As illustrated in FIG. 1B, the cooling fan of U.S. Pat. No. 7,345,884 is substantially the same as the previously disclosed cooling fan. The difference is that the printed circuit board 11' forms an extension part 11a extending outside for a control chip 110' provided thereon so as to provide the control chip 110' outside a gap between a base 120' of a housing 12' and a wheel hub 130' of a fan wheel 13' or partially exposing the gap such that airflow driven by the fan wheel 13' can dissipate the heat generated by the control chip 110'.

However, the formation of the above-mentioned extension part 11a of the printed circuit board 11' will interfere the airflow driven by the fan wheel 13' when rotating. The airflow will generate noises when being interfered, thereby affecting the utilization quality of the electronics having such kind of cooling fan provided thereon. Meanwhile, since the extension part 11a extends outside, a blade 132' and the control chip 110' have to remain a predetermined gap therebetween. It is harm to the decrease of the overall height of the prior cooling fan, thereby not complying with the requirement of a thin electronics.

Furthermore, for the previously disclosed prior cooling fan, the printed circuit board 11' still needs to be provided between the wheel hub 130' of the fan wheel 13' and the base 120' of the housing 12'. It is resulted in that the thickness of the printed circuit board 11' will still affect the overall height of the cooling fan and the thin cooling fan can not be further realized.

SUMMARY OF THE INVENTION

In view of this, the present invention provides a semiconductor package having a cooling fan and a method of fabricating the same, to efficiently decrease the overall thickness of the cooling fan.

The present invention provides a semiconductor package, comprising: a substrate having a first surface and a second surface opposing the first surface, the first surface having a fan placement zone, a hole and a ventilation hole penetrating the substrate formed at the fan placement zone of the substrate; an electronic component disposed on the first surface surrounding the fan placement zone, the electronic component electrically connected to the substrate; an encapsulant formed on the electronic component and the first surface of the substrate, the encapsulant having an encapsulant opening exposing the fan placement zone; and a fan unit disposed in the encapsulant opening, the fan unit electrically connected to the substrate.

In order to obtain the aforementioned semiconductor package, the present invention provides a method of fabricating a semiconductor package, comprising: providing a substrate having a first surface and a second surface opposing the first surface, the first surface having a fan placement zone; forming a hole and a ventilation hole penetrating the substrate at the fan placement zone of the substrate; disposing an electronic component on the first surface surrounding the fan placement zone and electrically connected to the substrate; forming an encapsulant on the first surface of the substrate so as to cover the electronic component, the encapsulant having an encapsulant opening exposing the fan placement zone; and disposing a fan unit in the encapsulant opening and electrically connected to the substrate.

In the aforementioned method and the semiconductor package, the fan unit comprises a fan wheel positioned on the first surface of the substrate and rotatably jointed to the hole and a stator set such as a coil disposed and electrically connected to the substrate. The fan wheel has a wheel hub, a magnet provided on the inner side of the wheel nub, a plurality of blades provided on the outer side of the wheel hub, and a shaft pillar jointed to the wheel hub. The stator is disposed on the outer side of the shaft pillar.

The fan unit may also be, not limit to the above-mentioned structure, a fan module of other types. The difference between the fan unit of the present invention and the prior cooling fan is that the required electronic component is integrated on a packaging substrate having the fan unit combined thereon instead of the fan unit having an electronic component disposed therein such that the control chip in the electronic component sends a control signal to the stator set of the fan unit via the substrate so as to control the operation of the fan unit.

In another aspect, the electronic component further comprises a functional chip disposed on the substrate and embedded within the encapsulant. Accordingly, the semiconductor package having the functional chip further has active cooling performance except being a known package in the industry. In addition, a thermal pad is formed on the first surface and the second surface of the substrate, and thermal vias penetrate the substrate and are connected to the two thermal pads. And the functional chip is disposed on the thermal pad of the first surface of the substrate. Accordingly, heat generated by the functional chip is transmitted to an airflow channel below the substrate by the thermal pad and the thermal vias.

In a further aspect, the substrate of the semiconductor package further has a tool hole provided outside the encapsulant and penetrating the first surface and the second surface of the substrate. Alternatively, the substrate and the encapsulant further have a communicated tool hole penetrating the encapsulant and the first surface and the second surface of the substrate.

Also, if the semiconductor package of the present invention is enabled to be connected to other electrical devices such as a mother board or another package, the substrate may further has a conductive connection element connected thereto.

Since the plurality of electronic components comprising the control chip and the passive chip are disposed on the substrate outside the fan placemen zone, when the semiconductor package of the present invention is connected to the mother board or other electronic components and under the condition of normal operation of the fan unit, heat generated by the electronic component such as the control chip or the electrical devices below the semiconductor package may pass through the airflow channel below the substrate of the semiconductor package and then efficiently dissipate without the occurrence of the damage problem due to overheat. And since the electronic component such as the control chip is disposed on the substrate of the semiconductor package outside the fan placement zone, the area of the blade of the fan wheel will not be interfered. Hence the blade area of the fan wheel has larger extending tolerance with a certain space range, thereby increasing wind output. Since a housing is not necessary, the electronic component does not needs to be provided between the base of the housing and the wheel hub of the fan wheel, and the overall thickness of the fan unit can be decreased so as to comply with the requirement of thin electronics. Furthermore, since the control chip is disposed on a determined location of the substrate, airflow generated by the fan unit in action will not be interfered, thereby not generating noise or vibration problems.

In another aspect, the present invention further provides a semiconductor package stacked structure having a cooling fan, comprising: the semiconductor package having the cooling fan of the present invention; a bottom electrical device, comprising a carrying member and an electronic component disposed on the carrying member; and a conductive adhesion material, disposed between the semiconductor package and the bottom electrical device. And the substrate of the semiconductor package is connected on the conductive adhesion material so as to form an airflow channel between the semiconductor package and the bottom electrical device such that the fan unit dissipate heat generated by the bottom electrical device via the airflow channel. In a further aspect, the present invention further provides a semiconductor package having a cooling fan provided for stacking other electrical devices, comprising: a substrate, having a first and a second surface opposing the first surface, the first surface having a fan placement zone, a hole and a ventilation hole penetrating the substrate formed on the fan placement zone of the substrate; an electronic component, disposed on the first surface surrounding the fan placement zone and electrically connected to the substrate; an encapsulant, formed on the electronic component and the first surface of the substrate, having an encapsulant opening exposing the fan placement zone; a conductive pillar, provided on the first surface surrounding the fan placement zone, penetrating the encapsulant and connected to the substrate; and a fan unit, disposed in the encapsulant opening and electrically connected to the substrate. In addition, the semiconductor package having the cooling fan for stacking other electrical devices may further comprise a conductive adhesion material disposed on the conductive pillar for other electrical devices to be stacked on the conductive adhesion material. Alternatively, the conductive adhesion material is provided on the second surface of the substrate by which the semiconductor package is stacked on other electrical devices. Therefore, the heat generated by those multiple semiconductor packages structure can be dissipated by a fan unit. Alternatively, a plurality of semiconductor packages having the cooling fan for stacking other electrical devices can be stacked so as to provide larger wind and enhance dissipation performance.

BRIEF DESCRIPTION OF DRAWINGS

FIGS. 2A-2F' are cross-sectional views illustrating a method of fabricating a semiconductor package having a cooling fan in accordance with the present invention, wherein FIG. 2A is a cross-sectional view of FIG. 2A', FIGS. 2E' and 2E" are cross-sectional views of the semiconductor package having a tool hole, and FIGS. 2F and 2F' are cross-sectional views of the semiconductor package having a conductive connection element connected therein;

FIGS. 3A and 3B illustrate schematic diagrams of the semiconductor package comprising a functional chip, wherein FIG. 3B illustrates a cross-sectional view of FIG. 3A;

FIGS. 4A-4C illustrate cross-sectional views of a stacked structure of a semiconductor package having a cooling fan in accordance with the present invention, wherein FIG. 4A illustrates an embodiment of a carrying member being a mother board, FIGS. 4B and 4B' illustrate an embodiment of a bottom electrical device being a ball array semiconductor package, and FIG. 4C illustrates that the bottom electrical device further comprises an insulation material and a conductive pillar penetrating the insulation material;

DETAILED DESCRIPTION OF PREFERRED EMBODIMENTS

The following illustrative embodiments are provided to illustrate the technical content and the implementation way of the present invention in detail, advantages and effects of the present invention can be apparently understood by those in the art after reading the disclosure of this specification. The present invention can also be performed or applied by other different embodiments. The details of this specification may be on the basis of different points and applications, and numerous modifications and variations can be devised without departing from the spirit of the present invention.

Note that the structures, proportions, sizes depicted in the accompanying figures merely illustrate the disclosure of the specification to allow for comprehensive reading without a limitation to the implementation or applications of the present invention, and does not constitute any substantial technical meaning. Any variations or alterations to the structures, proportional relations or sizes should be encompassed within the scope of the disclosure. Meanwhile, terms cited in this specification, such as "above," "below," "internal," "external," "front," "back", "a," and "bottom," etc., are merely for clear description but not for limiting the implantable scope of the present invention. The change and regulation of their corresponding relationships are certainly considered to be in the implantable scope of the present invention without substantial change of the technical content.

The First Embodiment

Please refer to FIGS. 2A-2E, which are cross-sectional views of a method of fabricating a semiconductor package having a cooling fan in accordance with the present invention.

Figure 1A:
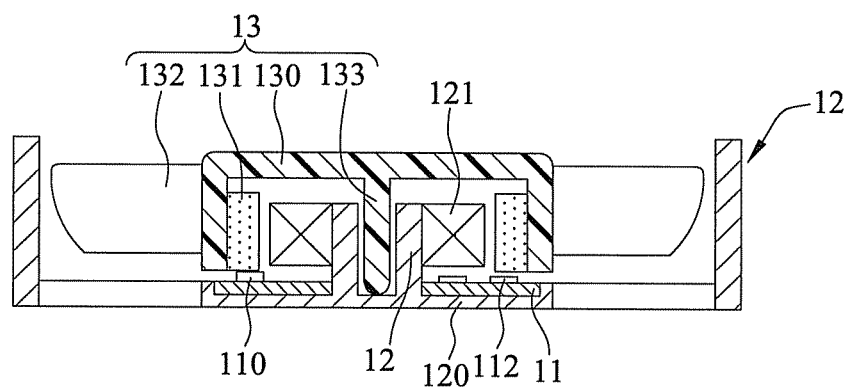
FIG. 1A illustrates a cross-sectional view of a cooling fan according to the prior art.
Figure 1B:
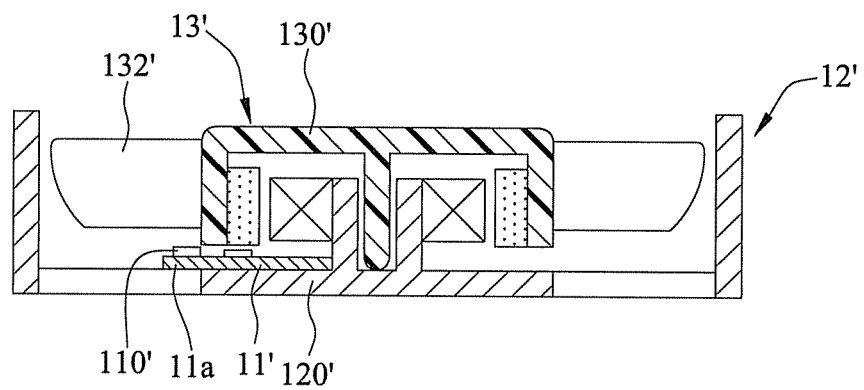
FIG. 1B illustrates a cross-sectional view of a cooling fan of U.S. Pat. No. 7,345,884.
Figure 2A:
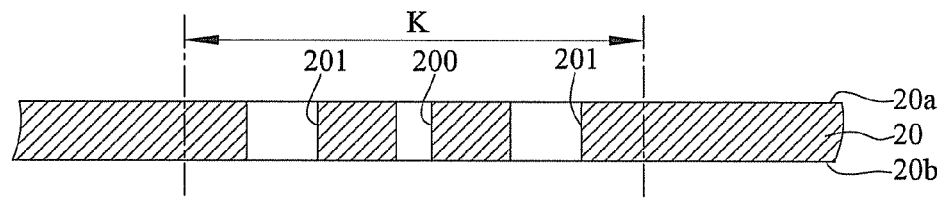
Figure 2A:
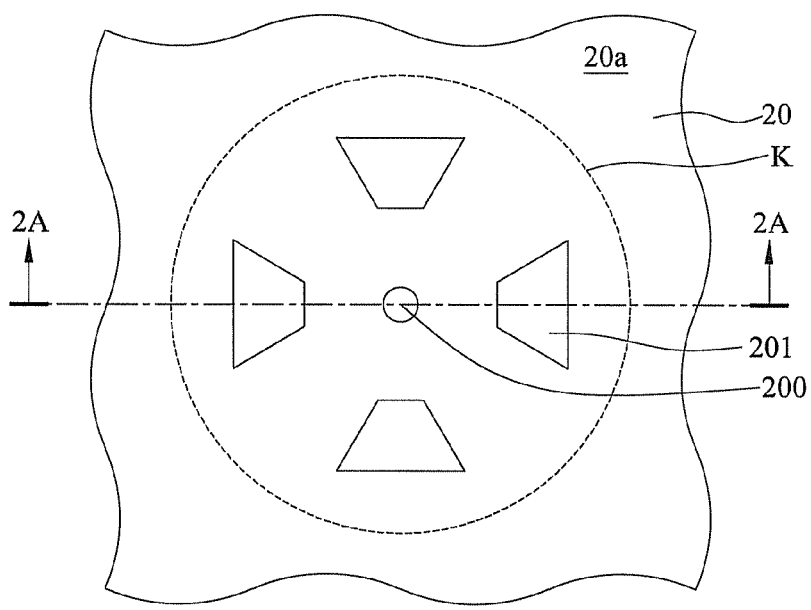

As illustrated in FIG. 2A, a substrate 20 having a first surface 20a and a second surface 20b that opposes the first surface 20a is provided, and the first surface 20a of the substrate 20 has a fan placement zone K. A hole 200 and a ventilation hole 201 penetrating the substrate 20 are formed on the fan placement zone K. As illustrated in FIG. 2A', the hole 200 is surrounded by four ventilation holes 201. Of course, the present invention does not limit the number and shape of the ventilation holes, there may be only two or more ventilation holes, and the ventilation hole may also be in the shape of a hive.

Figure 2B:
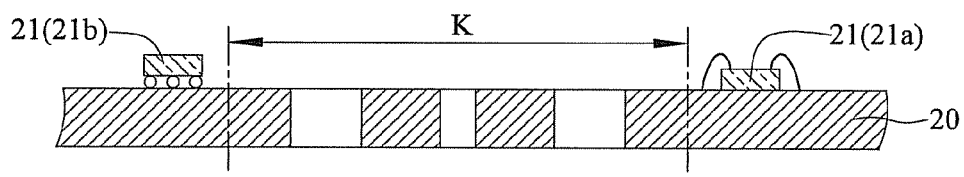

As illustrated in FIG. 2B, a plurality of electronic components 21 are disposed on the first surface 20a surrounding the fan placement zone K and electrically connected to the substrate 20. The electronic component 21 at least comprises a control chip 21a and a passive element 21b such as a resistor and a capacitor, and is used to send a control signal to the fan unit 23 via the substrate 20.

The electronic component 21 further comprises, for example, a south bridge chip, a north bridge chip, or other functional chips, such as graphics chips, display chips, and the like. Since these components are well-known for persons skilled in the art, further description is hereby omitted.

Figure 2C:
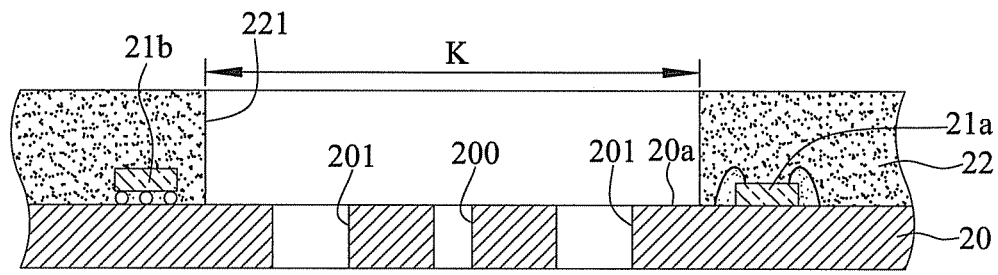

As illustrated in FIG. 2C, an encapsulant 22 is formed on the electronic component 21 and the first surface 20a of the substrate 20 so as to cover the electronic component 21. The encapsulant 22 has an encapsulant opening 221 exposing the fan placement zone K so as to expose a portion of the first surface 20a, the hole 200 and the ventilation hole 201.

Figure 2D:
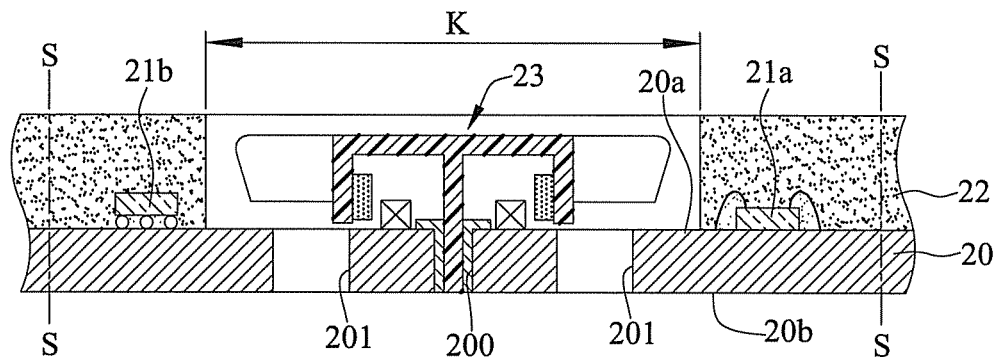

As illustrated in FIG. 2D, a fan unit 23 is disposed in the encapsulant opening 221 and electrically connected to the substrate 20 such that the control chip 21a sends the control signal to the fan unit 23 via the substrate 20 so as to control the operation of the fan unit 23.

In the present embodiment, the fan unit 23 comprises a fan wheel 230 positioned on the first surface 20a of the substrate 20 and rotatably jointed to the hole 200 and a stator set 231 disposed and electrically connected to the first surface 20a of the substrate 20.

The fan wheel 230 has a wheel hub 2300, a magnet 2301 provided on an inner side of the wheel hub 2300, a plurality of blades 2302 provided on an outer side of the wheel hub 2300, and a shaft pillar 2303 jointed to the wheel hub 2300. The stator set 231 surrounds the shaft pillar 2303. The fan wheel 230 is driven to rotate by a magnetic field generated by the magnet 2301 and the stator set 231 occurring a magnetic repulsion. Since the driving principle of the fan wheel 230 is the same as that of the prior art, further description is omitted.

In an embodiment of the present invention, the fan unit 23 further comprises a sleeve pipe 232 provided in the hole 200 such that the shaft pillar 2303 is rotatably jointed into the sleeve pipe 232.

Figure 2E:
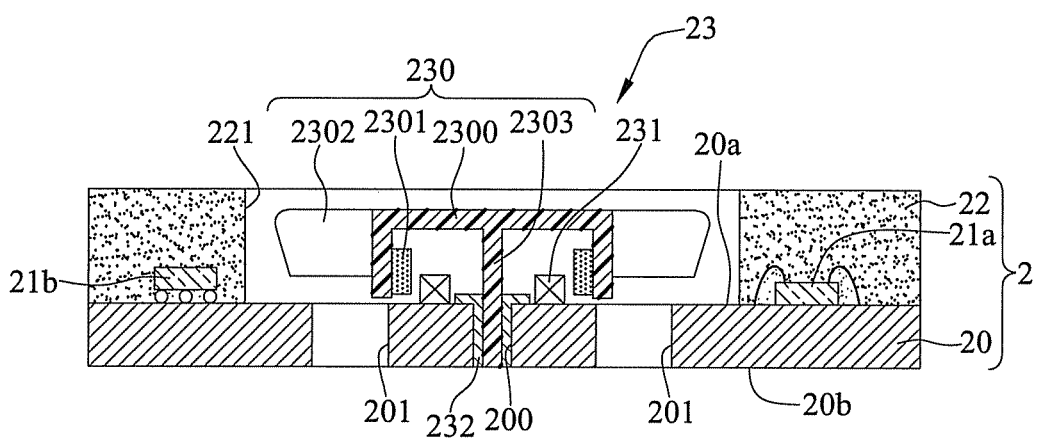
Figure 2E:
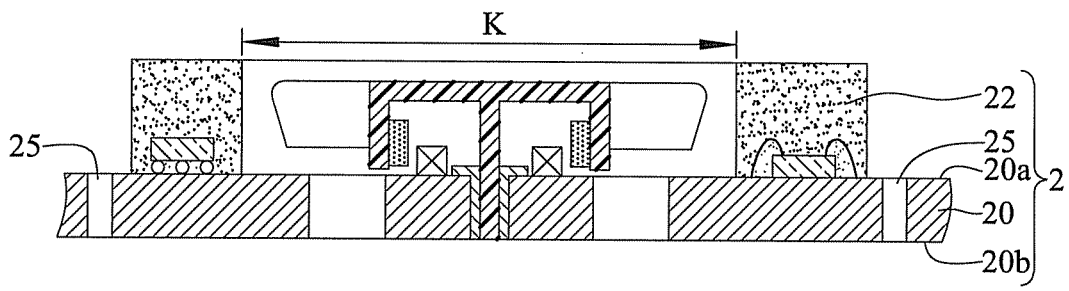

As illustrated in FIG. 2E, the encapsulant 22 is cut along an imaginary cutting line S (as illustrated in FIG. 2D) so as to obtain a semiconductor package 2.

In another embodiment, as illustrated in FIG. 2E', the encapsulant 22 does not completely cover the area outside the fan placement zone K on the substrate 20 such that the substrate 20 further has a space for providing a tool hole 25 by which the semiconductor package 2 of the present invention is fixed to other electrical devices such as a mother board, a semiconductor package of another invention or even other semiconductor packages. The tool hole 25 is provided outside the encapsulant 22 and penetrates the first surface 20a and the second surface 20b of the substrate 20 in which the semiconductor package 2 of the present invention is screwed or stuck. Of course, in the present embodiment, only the substrate 20 is cut when performing cutting operation.

In addition, as illustrated in a further embodiment in FIG. 2E", the semiconductor package 2 of the present invention further comprises the tool hole 25 formed on the substrate 20 and penetrating the encapsulant 22 and the first surface 20a and the second surface 20b of the substrate 20 after forming the encapsulant 22 by which the semiconductor package 2 of the present invention is fixed to other electrical devices.

Figure 2F:
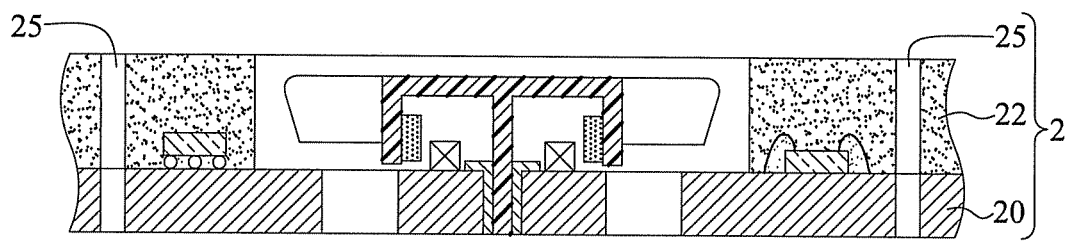
Figure 2F:
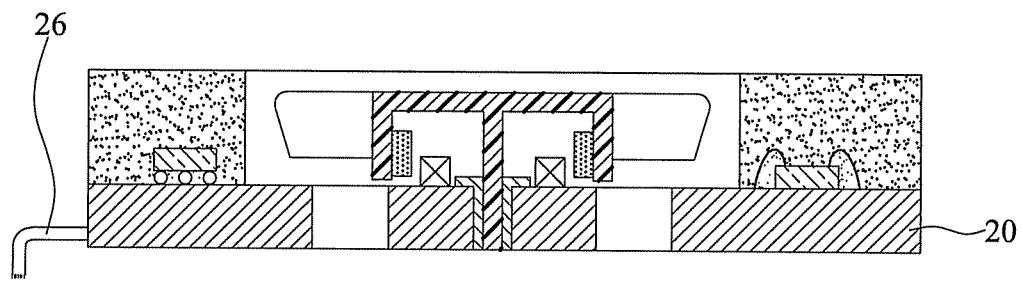
Figure 2F:
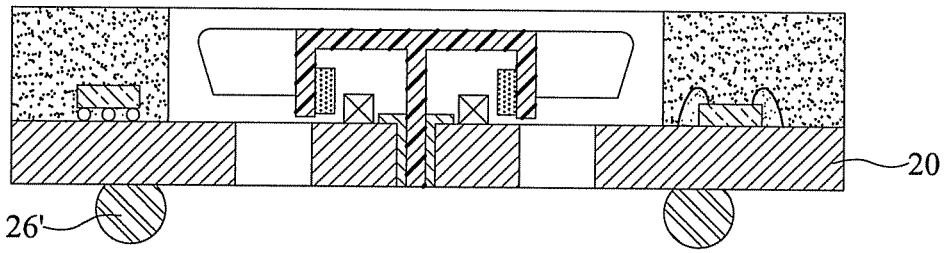

In another embodiment as illustrated in FIGS. 2F and 2F', the substrate 20 further has a conductive connection element 26 such as a cable or a conductive connection element 26' such as a solder ball connected thereto so as to be connected to other electrical devices.

It is known from above that the method of fabricating the semiconductor package having the cooling fan is primarily to combine and integrate the fan unit 23 and the electronic component 21 to the substrate 20, that is, to integrate the electronic component 21 onto the substrate 20 rather than in the structure of the fan unit 23, so as to effectively solve the problems with respect to the operation and design of a prior fan module.

Unlike the prior art, in which the control chip 110 is positioned in a gap between the base 120 of the housing 120 and the wheel hub 130 of the fan wheel 13 and the heat generated by the control chip 110 cannot be dissipated effectively, the present invention disposes the electronic component 21 such as the control chip 21a on a region outside of the fan placement zone K and covers the electronic component 21 with the encapsulant 22. When the semiconductor package 2 of the present invention is disposed on other electronic components or a circuit board, the fan unit 23 can dissipate the heat by an airflow channel below the substrate 20 of the semiconductor package 2.

Furthermore, the present invention horizontally integrates the electronic component 21 and the fan unit 23 on the substrate 20, without using the housing as prior art. Thus, it can not only decrease space but also benefit decreased overall height of the fan unit so as to comply with the requirement of thin and small electronics.

Since the electronic component 21 is disposed on the substrate 20 outside the fan placement zone K, the area of the blade 2302 is not affected by the electronic component 21 and is thus effectively increased. The area of the blade 2302 can expand the scope of the fan placement zone K based on requirements and thus be increased, thereby benefitting the addition of the wind and the cooling efficient.

Since the fan unit 23 of the present invention is directly integrated on the substrate 20, additional utilization of printed circuit board is not necessary, and the overall height of the fan unit 23 can be decreased so as to comply with the requirement of thin electronics. And it has effects of decreased cost and economical assembly time and process.

The present invention further provides a semiconductor package having a cooling fan, comprising: a substrate 20 having a first surface 20a and a second surface 20b that opposes the first surface 20a, the first surface 20a having a fan placement zone K, a hole 200 and a ventilation hole 201 formed on the fan placement zone K penetrating the substrate 20; an electronic components 21 disposed on the first surface 20a surrounding the fan placement zone K and electrically connected to the substrate 20; an encapsulant 22 formed on the electronic component 21 and the first surface 20a of the substrate 20 and having an encapsulant opening 221 exposing the fan placement zone K so as to expose a portion of the first surface 20a, the hole 200 and the ventilation hole 201; and a fan unit 23 disposed in the encapsulant opening 221 and electrically connected to the substrate 20.

The ventilation hole 201 is positioned on the surrounding of the hole 200. Of course, the present invention does not limit the number and shape of the ventilation hole, there may be only two or more ventilation holes, and the ventilation hole may also be in the shape of a hive. The electronic component 21 at least comprises a control chip 21a and a passive element 21b. The control chip 21a is used to send a control signal to the fan unit 23 via the substrate 20 so as to control the operation of the fan unit 23.

The fan unit 23 comprises a fan wheel 230 positioned on the first surface 20a of the substrate 20 and rotatably jointed to the hole 200 and a stator set 231 disposed and electrically connected to the substrate 20. The fan wheel 230 has a wheel hub 2300, a magnet 2301 provided on an inner side of the wheel hub 2300, a plurality of blades 2302 provided on an outer side of the wheel hub 2300, and a shaft pillar 2303 jointed to the wheel hub 2300. The stator set 231 is disposed to surround the shaft pillar 2303. In addition, the fan unit 23 further comprises a sleeve pipe 232 provided in the hole 200 such that the shaft pillar 2303 is rotatably jointed into the sleeve pipe 232.

In another embodiment, as illustrated in FIG. 2E', the encapsulant 22 does not completely cover the area outside the fan placement zone K on the substrate 20 such that the substrate 20 further has a space for providing a tool hole 25 by which the semiconductor package 2 of the present invention is fixed to other electrical devices such as a mother board, a semiconductor package of another invention, or even other semiconductor packages. The tool hole 25 is provided outside the encapsulant 22 and penetrates the first surface 20a and the second surface 20b of the substrate 20 in which the semiconductor package 2 of the present invention is screwed or stuck.

In addition, as illustrated in a further embodiment in FIG. 2E", the substrate 20 and the encapsulant 22 further have the communicated tool hole 25 penetrating the encapsulant 22 and the first surface 20a and the second surface 20b of the substrate 20 by which the semiconductor package 2 of the present invention is fixed to other electrical devices.

In another embodiment, as illustrated in FIGS. 2F and 2F', the substrate 20 further has a conductive connection element 26 such as a cable or a conductive connection element 26' such as a solder ball connected thereto so as to be connected to other electrical devices. When using the solder ball as a conductive connection member, it can eliminate the traditional fastening way of sticking or locking and the like so as to mount the semiconductor package having the cooling fan on a heat generation member by a consistent SMT process.

The Second Embodiment

Figure 3A:
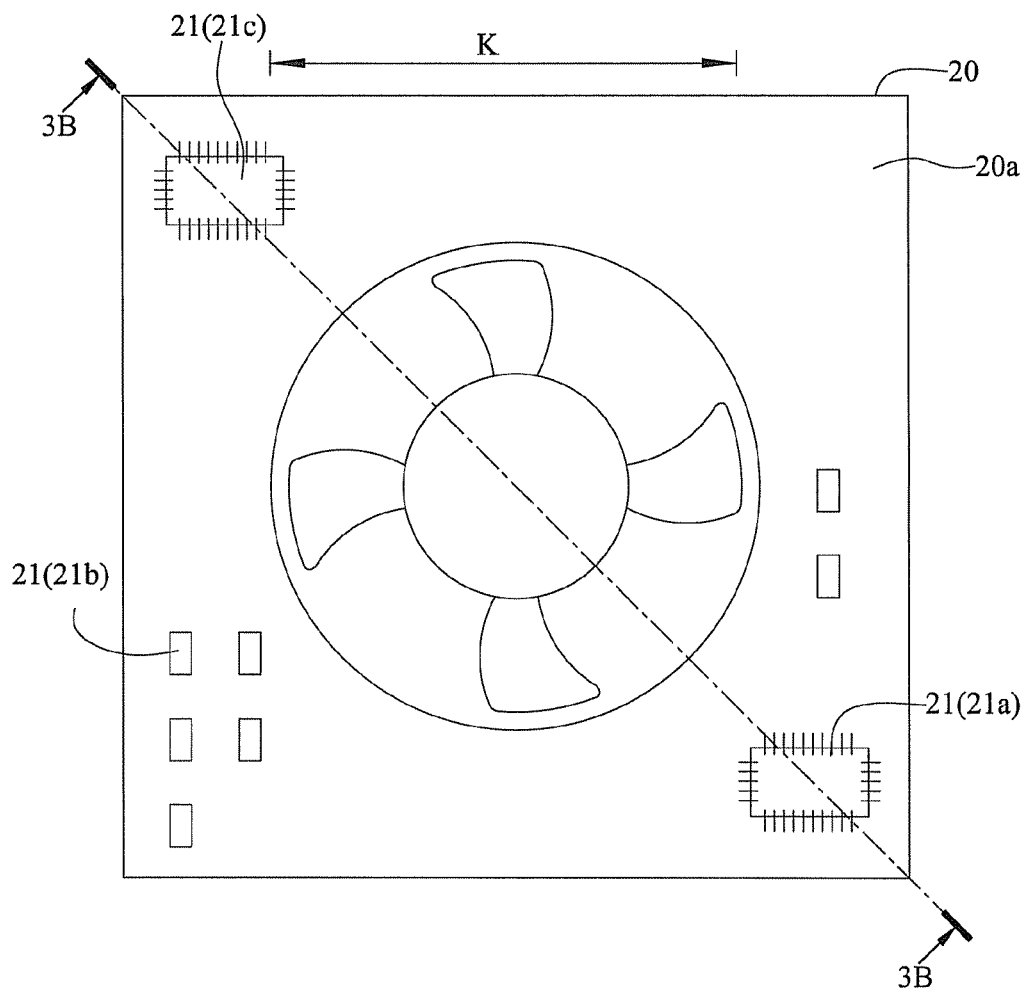
Figure 3B:
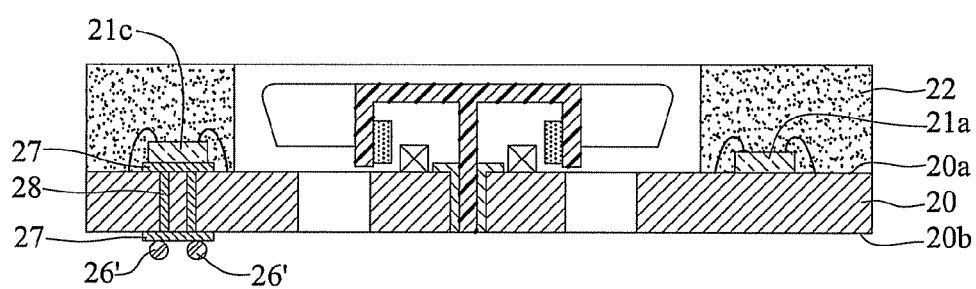

In another method of fabricating the semiconductor package having the cooling fan according to the present invention, as illustrated in FIGS. 3A and 3B, the electronic member 21, provided on the first surface 20a surrounding the fan placement zone K, further comprise a functional chip 21c which is electrically connected on the substrate 20 and embedded within the encapsulant 22 after forming the encapsulant 22. Additionally, a thermal pad 27 is formed on the first surface 20a and the second surface 20b of the substrate 20, and thermal vias 28 penetrate the substrate 20 and connect the two thermal pads 27. And the functional chip 21c is thermally connected on the thermal pad 27 of the first surface 20a of the substrate 20. In addition, the conductive connection element 26' such as a solder ball can be connected to the thermal pad 27 below the second surface 20b so as to transmit heat to the underneath of the substrate 20 and/or be electrically connected to other electrical devices.

The Third Embodiment

Figure 4A:
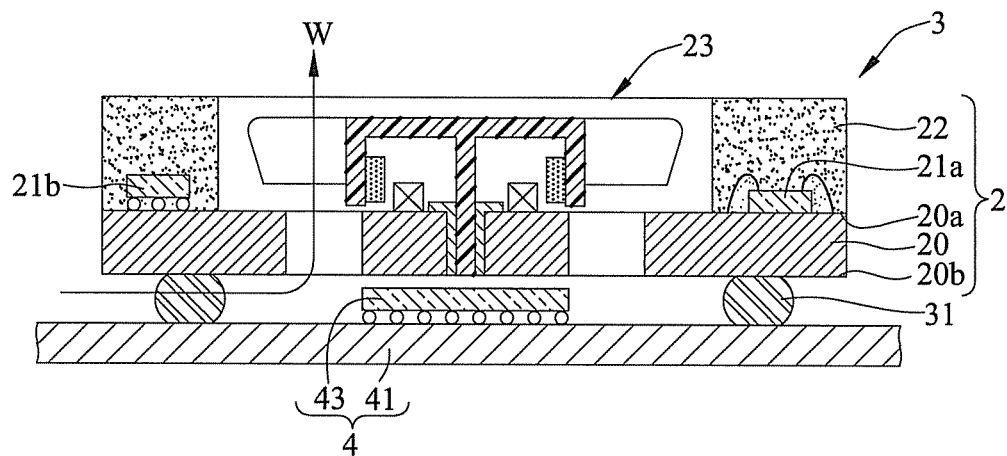
Figure 4B:
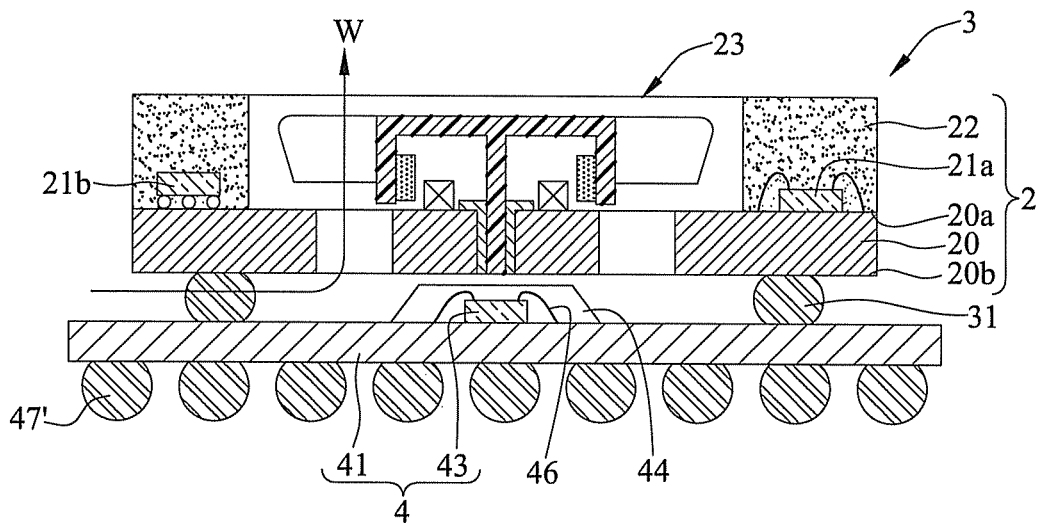
Figure 4B:
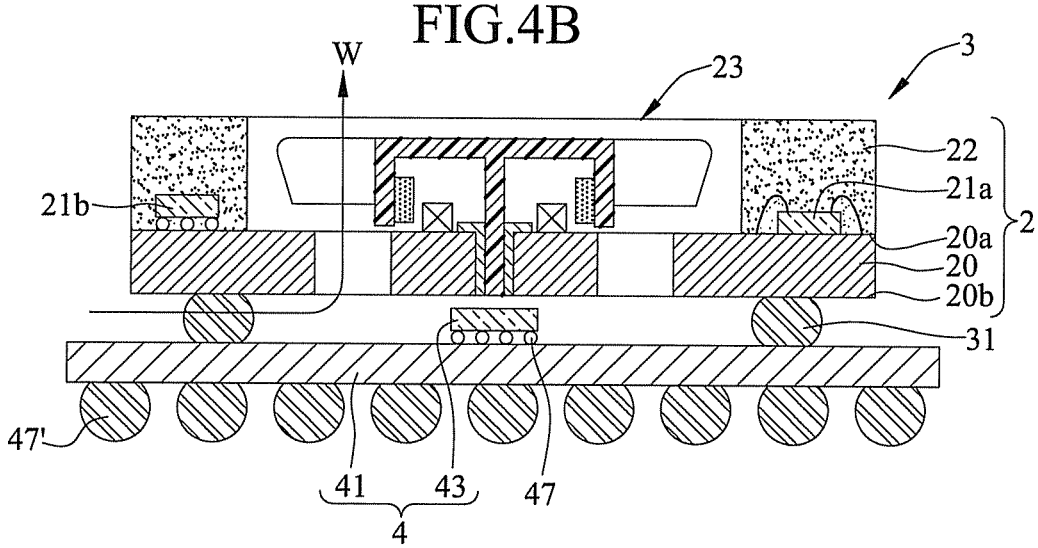
Figure 4C:
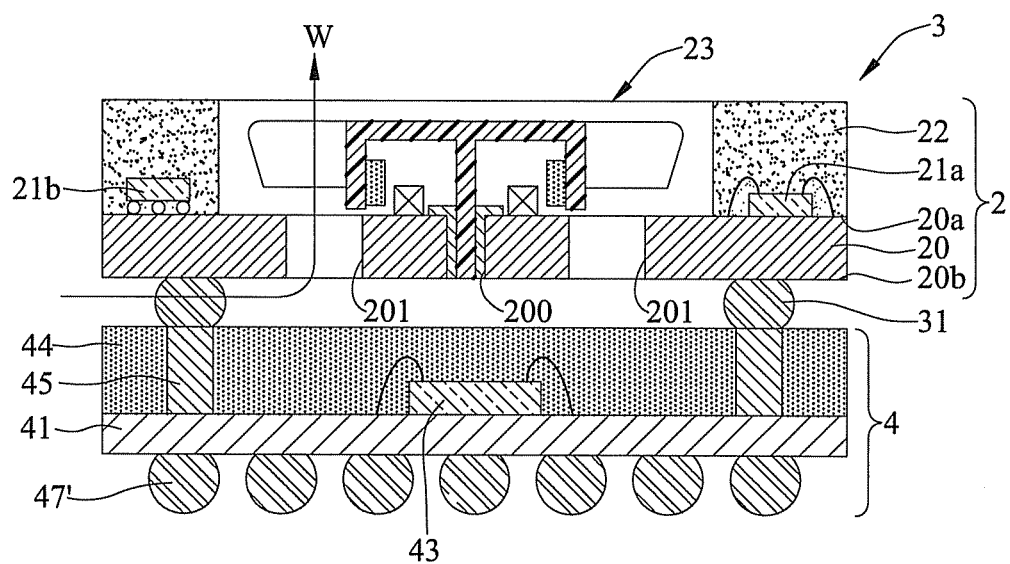

As illustrated in FIGS. 4A-4C following the structure of FIG. 2E, the present invention further provides a semiconductor package stacked structure 3 having the cooling fan, comprising: the semiconductor package 2 having the cooling fan as the present invention; a bottom electrical device 4, comprising a carrying member 41 and an electronic component 43 is being electrically connected to the carrying member 41; and a conductive adhesion material 31 such as a solder ball, disposed between the semiconductor package 2 and the bottom electrical device 4. The substrate 20 of the semiconductor package 2 is connected on the conductive adhesion material 31 so as to form an airflow channel W between the semiconductor package 2 and the bottom electrical device 4 such that the fan unit 23 dissipates heat generated by the bottom electrical device 4 via the airflow channel W.

As illustrated in FIG. 4A, the carrying member 41 involved in the bottom electrical device 4 may be a mother board, while the electronic component 43 is being electrically connected to the mother board so as to dissipate heat generated by the electronic component 43.

As illustrated in FIG. 4B, the bottom electrical device 4 may be a ball array semiconductor package. Therefore, the carrying member 41 is a substrate, the electronic component 43 is electrically connected to the substrate via a gold wire 46, and the bottom electrical device 4 further comprises an insulation material 44 formed on the substrate and covering the electronic component 43.

As illustrated in FIG. 4B', the bottom electrical device 4 may be a flip chip ball array semiconductor package. Therefore, the carrying member 41 is a substrate while the electronic component 43 is electrically connected to the substrate via a solder ball 47. As illustrated in FIGS. 4B and 4B', the bottom surface of the carrying member 41 may further has a plurality of solder balls 47' connected thereto.

In another aspect illustrated in FIG. 4C, different from that illustrated in FIGS. 4B and 4B', the aforementioned bottom electrical device 4 of the semiconductor package stacked structure 3 further comprises: a conductive pillar 45 formed on the carrying member 41; and the insulation material 44 formed on the carrying member 41 and covering the electronic component 43 and the conductive pillar 45. The conductive adhesion material 31 is provided on the conductive pillar 45 penetrating the insulation material 44. The bottom electrical device 4 illustrated in FIG. 4C is not used to limit the assembly way of elements. In other words, the electronic component 43 such as a chip may also be electrically connected to the carrying member 41 via bonding wires or a flip chip way.

The Fourth Embodiment

Figure 5A:
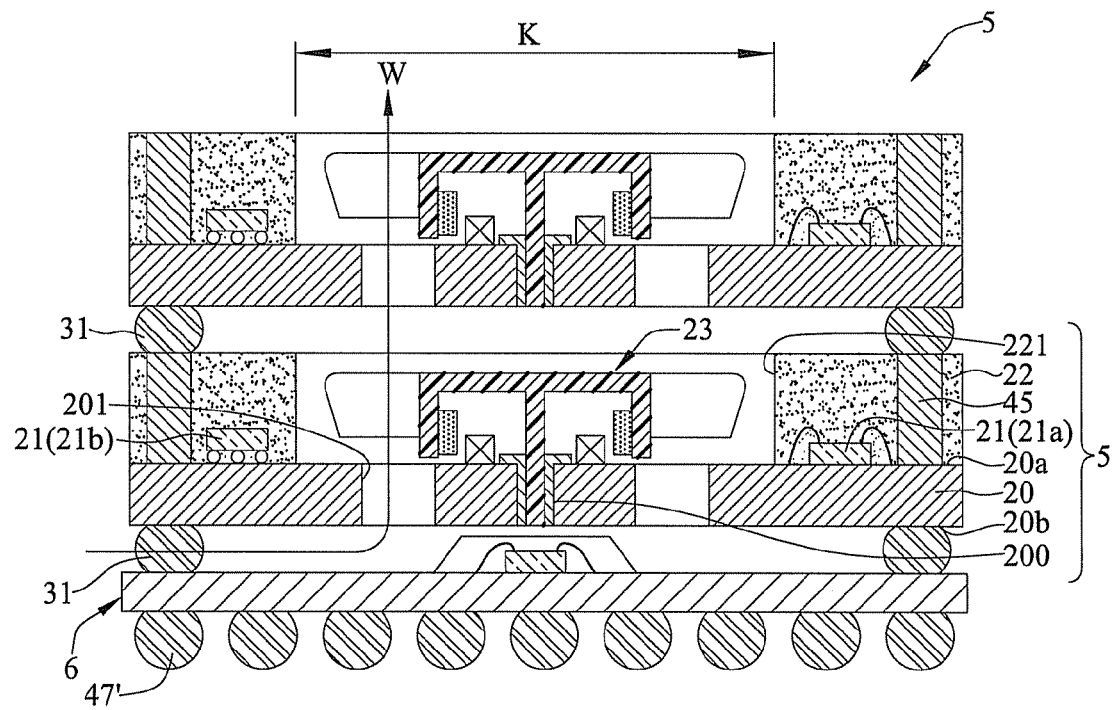
FIG. 5A illustrates a cross-sectional view of a semiconductor package having a cooling fan for stacking other electrical devices.

As illustrated in FIG. 5A, the present invention further provides a semiconductor package 5 having a cooling fan provided for stacking other electrical devices, comprising: a substrate 20, having a first surface 20a and a second surface 20b that opposes the first surface 20a, the first surface 20a having a fan placement zone K, a hole 200 and a ventilation hole 201 penetrating the substrate 20 formed on the fan placement zone K of the substrate 20; an electronic components 21, disposed on the first surface 20a surrounding the fan placement zone K and electrically connected to the substrate 20; an encapsulant 22, formed on the electronic component 21 and the first surface 20a of the substrate 20, having an encapsulant opening 221 exposing the fan placement zone K so as to expose a portion of the first surface 20a, the hole 200 and the ventilation hole 201; a conductive pillar 45, provided on the first surface 20a surrounding the fan placement zone K, penetrating the encapsulant 22 and connected to the substrate 20; and a fan unit 23, provided in the encapsulant opening 221 and electrically connected to the substrate 20.

In addition, the aforementioned semiconductor package 5 having the cooling fan provided for stacking other electrical devices may further comprise a conductive adhesion material 31 such as a solder ball which is provided on the conductive pillar 45 for other electrical devices to be stacked on the conductive adhesion material 31. Alternatively, the conductive adhesion material 31 is provided on the second surface 20b of the substrate 20 by which the aforementioned semiconductor package 5 is stacked on other electrical devices. In the present embodiment, other electrical devices may be stacked and electrically connected above and below the semiconductor package 5 having the cooling fan provided for stacking other electrical devices. As illustrated in FIG. 5A, another semiconductor package 5 may be stacked on the semiconductor package 5 having the cooling fan provided for stacking other electrical devices while on which a bottom electrical device 6 (for example, electronic component or other semiconductor packages (such as ball array semiconductor packages and the like) provided on the mother board) may be stacked.

Furthermore, in the fourth embodiment of the present invention, the semiconductor package 5 having the cooling fan provided for stacking other electrical devices can be fabricated as the first and second embodiments. Specifically, as illustrated in FIG. 2A', the hole 200 may be surrounded by four ventilation holes 201. Of course, the present invention does not limit the number and shape of the ventilation hole, there may be only two or more ventilation holes, and the ventilation hole may also be one of hive shape.

As illustrated in FIG. 2B, a plurality of electronic components 21 are disposed on the first surface 20a surrounding the fan placement zone K and electrically connected to the substrate 20. The electronic component at least comprises a control chip 21a and a passive element 21b such as a resistance and a capacitance. And the control chip 21a is used to send a control signal to the fan unit 23 via the substrate 20.

The electronic component 21 for example further comprises a south bridge chip, a north bridge chip, or other functional chips such as graphics chips and display chips and the like. Since these components are well-known for persons skilled in the art, further description is hereby omitted.

Figure 5B:
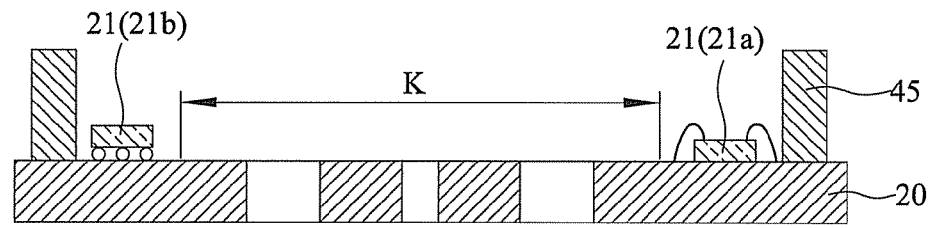
FIGS. 5B and 5C illustrate a schematic diagram of a formation method of the conductive pillar of the semiconductor package illustrated in FIG. 5A.

Since the semiconductor package of the present embodiment further has the conductive pillar 45, the conductive pillar 45 electrically connected to substrate 20 can be formed before or after disposing the electronic component 21, as illustrated in FIG. 5B.

As illustrated in FIG. 2C, an encapsulant 22 is formed on the electronic 21 and the first surface 20a of the substrate 20 so as to cover the electronic component 21 and the conductive pillar 45. And the encapsulant 22 has an encapsulant opening 221 exposing the fan placement zone K so as to expose a portion of the first surface 20a, the hole 200 and the ventilation hole 201. Since the conductive pillar 45 illustrated in FIG. 5A penetrates and exposes the encapsulant 22, the top surface of the encapsulant 22 can be further planarized exemplarily by a CMP process after forming the encapsulant 22.

Figure 5C:
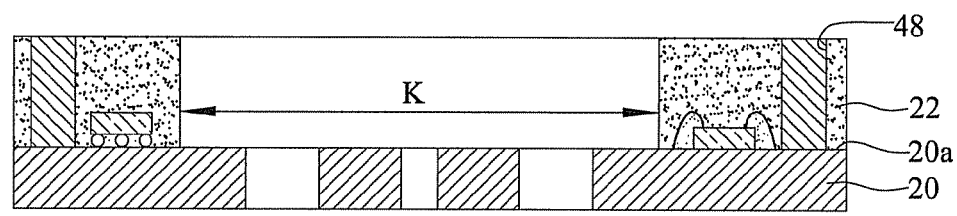

As illustrated in FIG. 5C, different from the aforementioned formation way of the conductive pillar 45, a hole 48 penetrating the encapsulant 22 may be further formed on the first surface 20a of the substrate 20 exemplarily by a laser drill approach after forming the encapsulant 22. Then, the conductive pillar 45 illustrated in FIG. 5A is formed in the hole 48 exemplarily by a plating approach.

Further referring to FIG. 2D, a fan unit 23 is disposed in the encapsulant opening 221 and electrically connected to the substrate 20 such that the control chip 21a send a control signal to the fan unit 23 via the substrate 20 so as to control the operation of the fan unit 23.

In the present embodiment, the fan unit 23 comprises a fan wheel 230 positioned on the first surface 20a of the substrate 20 and rotatably jointed to the hole 200 and a stator set 231 disposed and electrically connected to the first surface 20a of the substrate 20.

In detail, the fan wheel 230 has a wheel hub 2300, a magnet 2301 provided on an inner side of the wheel hub 2300, a plurality of blades 2302 provided on an outer side of the wheel hub 2300 and a shaft pillar 2303 jointed to the wheel hub 2300. And the stator set 231 is disposed to surround the shaft pillar 2303. The fan wheel 230 is driven to rotate by a magnetic field generated by the magnet 2301 and the stator set 231 occurring a magnetic repulsion. Since the driving principle of the fan wheel 230 is the same as that of the prior art, further description is omitted.

The fan unit 23 further comprises a sleeve pipe 232 provided in the hole 200 such that the shaft pillar 2303 is rotatably jointed into the sleeve pipe 232.

Next, as illustrated in FIG. 2E, the encapsulant 22 is cut along a cutting imaginary line S (as illustrated in FIG. 2D) so as to obtain a semiconductor package 2.

In another embodiment as illustrated in FIG. 2E', the encapsulant 22 does not completely cover the area outside the fan placement zone K on the substrate 20 such that the substrate 20 further has a space for providing a tool hole 25 by which the semiconductor package 2 of the present invention is fixed to other electrical devices such as a mother board, a semiconductor package of another invention or even other semiconductor packages. The aforementioned tool hole 25 is provided outside the encapsulant 22 and penetrates the first surface 20a and the second surface 20b of the substrate 20 in which the semiconductor package 2 of the present invention is screwed or stuck. Of course, in the present embodiment, merely the substrate 20 is cut when performing cutting operation.

In addition, as illustrated in a further embodiment in FIG. 2E", the semiconductor package 2 of the present invention further comprises the tool hole 25 formed on the substrate 20 and penetrating the encapsulant 22 and the first surface 20a and the second surface 20b of the substrate 20 after forming the encapsulant 22 by which the semiconductor package 2 of the present invention is fixed to other electrical devices.

In another embodiment as illustrated in FIGS. 2F and 2F', the substrate 20 further has a conductive connection element 26 such as a cable or a conductive connection element 26' such as a solder ball connected thereto so as to be connected to other electrical devices.

In addition, a functional chip 21c may also be disposed on the first surface 20a surrounding the fan placement zone K as the ways of the second embodiment. In this aspect, as illustrated in FIG. 3B, a thermal pad 27 is formed on the first surface 20a and the second surface 20b of the substrate 20, and thermal vias 28 penetrate the substrate 20 and connect the two thermal pads 27. In the fourth embodiment of the present invention, a conductive pillar 45 is formed in the semiconductor package having the cooling fan which originally is light, thin, short and small so as to obtain an active cooling semiconductor package of which the top and bottom surfaces both can be provided for stacking and electrically connecting other electrical devices. Accordingly, cooling efficient is increased when necessary but not affecting the dimension of electronics. Additionally, the stacked structure provided by the semiconductor package 5 having the cooling fan for stacking other electrical devices does not interfere the flow of cooling airflow. Hence, noises will not be generated.

The Fifth Embodiment

Figure 6A:
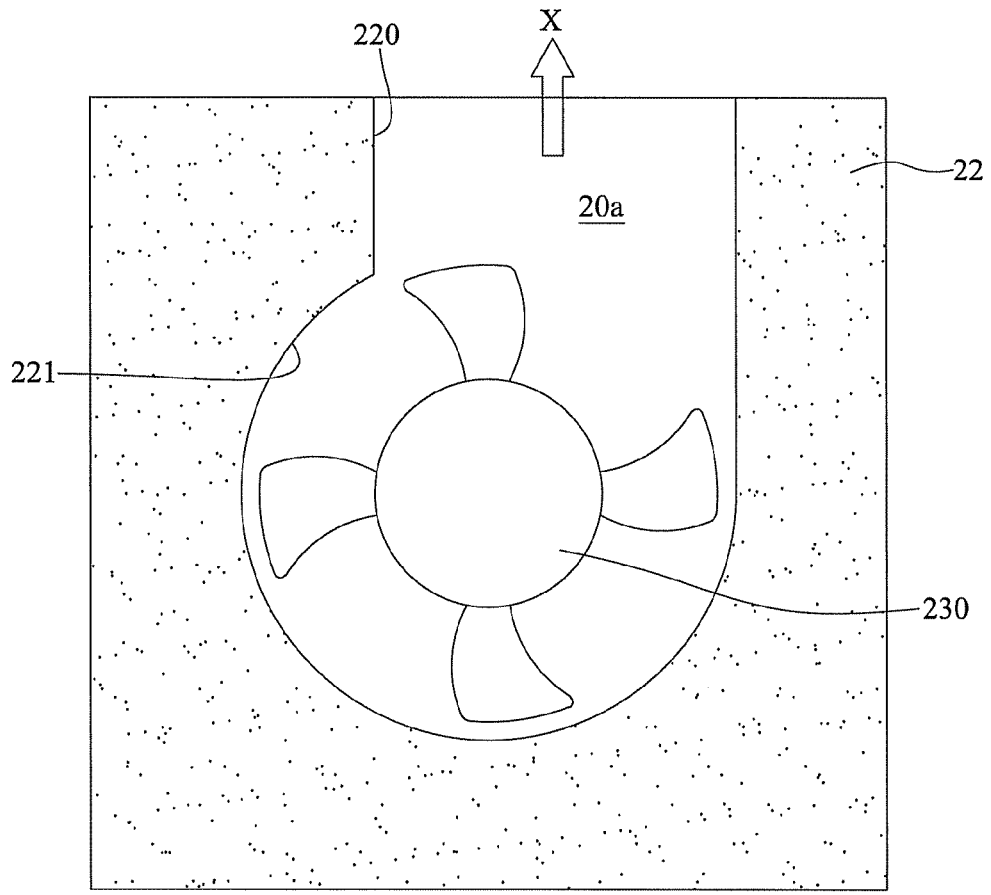
FIG. 6A illustrates a top view of a semiconductor package of a fifth embodiment according to the present invention.

In another semiconductor package having a cooling fan according to the present invention, as illustrated in FIG. 6A, the encapsulant 22 further has a guiding slot 220 adjacent to and in communication with the encapsulant opening 221 and extending to the edge of the encapsulant 22. The semiconductor package further comprises a cover 29 having an aperture 290 provided on the encapsulant 22 so as to cover the guiding slot 220. The aperture 290 corresponds to the position of the encapsulant opening 221 so as to expose the part of the fan wheel 230.

Figure 6B:
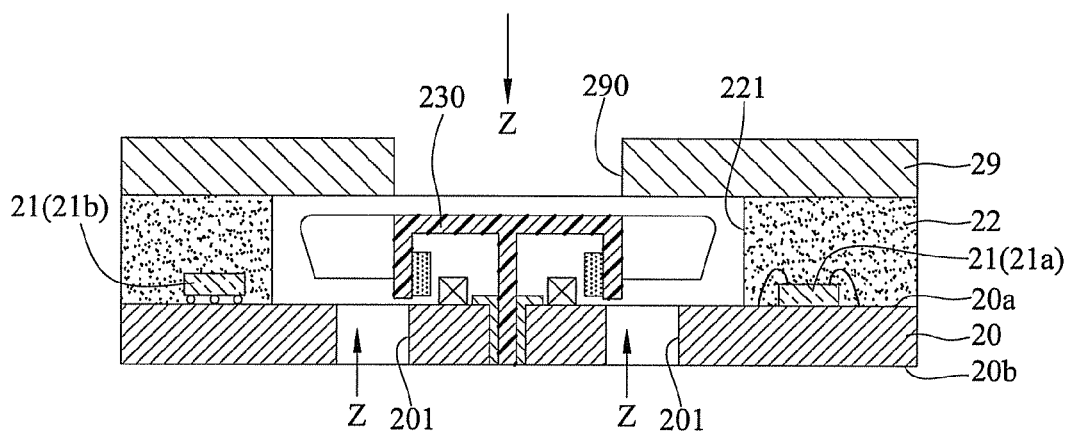
FIG. 6B illustrates a cross-sectional view of the semiconductor package of the fifth embodiment according to the present invention.

In the fifth embodiment, an airflow is inputted from the aperture 290 and the ventilation hole 201 by the fan unit 23, while hot air is outputted from the guiding slot 220 so as to efficiently dissipate the hot air generated by the electronic component 21. That is, a blow-off cooling structure is formed by using the guiding slot 220 and the cover 29. As illustrated in FIGS. 6A and 6B, an suck direction Z of wind may be up or down while the blow-off direction X can be front, back, left or right.

Furthermore, for example, the cover 29 may be a plastic plate or a metal plate and the like, without a specific limitation. Also, the aperture 290 is merely needed to let wind to flow through. Hence, the dimension of the aperture is not limited but properly smaller than the encapsulant opening 221.

The present invention integrates the fan unit onto the packaging substrate via semiconductor packaging technology. And the electronic component driving the fan unit is also horizontally provided on the substrate outside the fan placement zone so as to decrease the overall height of the fan unit. And when the semiconductor package having the cooling fan of the present invention is connected to other electronic components or circuit boards, hot air generated by the electronic component including the semiconductor package can also be dissipated by the formation of the airflow channel. In addition, the semiconductor package having the cooling fan fabricated by the method provided by the present invention not only protects the electronic component by the encapsulant (because the electronic component such as a control chip is disposed on the substrate outside the fan placement zone) but also does not interfere the airflow driven by the fan unit, thereby not resulting in the generation of the noises or affecting the rotation stability of the fan unit.

The foregoing descriptions of the detailed embodiments are only exemplarily illustrated to disclose the principles and effects of the present invention and not restrictive of the scope of the present invention. One skilled in the art could modify the previous embodiments without violating the spirit and scope of the present invention. Hence, the disclosure of the present invention should fall within the scope of the appended claims.

What is claimed is:

1. A semiconductor package, comprising:
a substrate having a first surface and a second surface opposing the first surface, the first surface having a fan placement zone, a hole and a ventilation hole penetrating the substrate formed at the fan placement zone of the substrate;
an electronic component disposed on the first surface surrounding the fan placement zone, the electronic component electrically connected to the substrate;

an encapsulant formed on the electronic component and the first surface of the substrate, the encapsulant having an encapsulant opening exposing the fan placement zone; and a fan unit disposed in the encapsulant opening, the fan unit electrically connected to the substrate.

2. The semiconductor package of claim 1, wherein the ventilation hole surrounds the hole.

3. The semiconductor package of claim 1, wherein the electronic component comprises a control chip and a passive element.

4. The semiconductor package of claim 3, wherein the control chip sends a control signal to the fan unit via the substrate so as to control the fan unit.

5. The semiconductor package of claim 3, wherein the electronic component further comprises a functional chip disposed on the substrate and embedded in the encapsulant.

6. The semiconductor package of claim 5, further comprising two thermal pads formed on the first surface and the second surface of the substrate, and thermal vias penetrating the substrate and connected to the two thermal pads, wherein the functional chip is disposed on the thermal pad on the first surface of the substrate.

7. The semiconductor package of claim 1, wherein the fan unit comprises a fan wheel positioned on the first surface of the substrate and rotatably jointed to the hole and a stator set disposed on and electrically connected to the substrate.

8. The semiconductor package of claim 7, wherein the fan wheel has a wheel hub, a magnet provided on the inner side of the wheel nub, a plurality of blades provided on the outer side of the wheel hub, and a shaft pillar jointed to the wheel hub, and wherein the stator is provided on the outer side of the shaft pillar.

9. The semiconductor package of claim 8, wherein the fan unit further comprises a sleeve pipe provided in the hole such that the shaft pillar is rotatably jointed into the sleeve pipe.

10. The semiconductor package of claim 1, wherein the substrate further has a tool hole provided outside the encapsulant and penetrating the first surface and the second surface of the substrate.

11. The semiconductor package of claim 1, wherein the substrate and the encapsulant further have a communicated tool hole penetrating the encapsulant and the first surface and the second surface of the substrate.

12. The semiconductor package of claim 1, wherein the substrate further has a conductive connection element connected thereto so as to be connected to other electrical devices.

13. The semiconductor package of claim 1, further comprises a conductive pillar provided on the first surface surrounding the fan placement zone, the conductive pillar penetrating the encapsulant and electrically connected to the substrate.

14. The semiconductor package of claim 1, wherein the encapsulant further has a guiding slot adjacent to and in communication with the encapsulant opening, the guiding slot extending to the edge of the encapsulant, wherein the semiconductor package further comprises a cover having an aperture, the cover provided on the encapsulant so as to cover the guiding slot, and wherein the aperture corresponds in position to the encapsulant opening.

* * * * *